United States Patent
Bechtel et al.

(10) Patent No.: US 6,873,091 B2
(45) Date of Patent: Mar. 29, 2005

(54) ORGANIC ELECTROLUMINESCENT DISPLAY DEVICE COMPRISING AN OPTICAL FILTER

(75) Inventors: Hans-Helmut Bechtel, Roetgen (DE); Markus Heinrich Klein, Aachen (DE); Joachim Opitz, Aachen (DE); Henricus Franciscus Johannus Jacobus Van Tongeren, Eindhoven (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 276 days.

(21) Appl. No.: 10/188,130

(22) Filed: Jul. 2, 2002

(65) Prior Publication Data

US 2003/0011306 A1 Jan. 16, 2003

(30) Foreign Application Priority Data

Jul. 5, 2001 (DE) .......................................... 101 32 699

(51) Int. Cl.$^7$ .............................................. H05B 33/00
(52) U.S. Cl. ........................ 313/112; 313/504; 313/506; 428/917
(58) Field of Search ................................. 313/112, 504, 313/506, 509; 428/917, 690; 359/308, 577, 614, 885

(56) References Cited

U.S. PATENT DOCUMENTS

| | | | |
|---|---|---|---|
| 5,049,780 A | * | 9/1991 | Dobrowolski et al. ...... 313/509 |
| 6,117,529 A | * | 9/2000 | Leising et al. .............. 428/209 |
| 6,576,352 B2 | * | 6/2003 | Hirai .......................... 428/690 |

FOREIGN PATENT DOCUMENTS

| | | | | |
|---|---|---|---|---|
| EP | 0272 760 | * | 6/1988 | |
| WO | WO0106816 | | 1/2001 | ........... H05B/33/22 |

* cited by examiner

*Primary Examiner*—Ashok Patel

(57) ABSTRACT

An organic electroluminescent display device comprising a front electrode member, a counterelectrode member, an organic electroluminescent member arranged between the front electrode member and the counterelectrode member, and an optical filter member with a cut-off filter to absorb electromagnetic radiation whose wavelength is below a cut-off wavelength $\lambda_k$, and to transmit electromagnetic radiation whose wavelength is above a cut-off wavelength $\lambda_k$, has an improved contrast under bright ambient light conditions.

9 Claims, 1 Drawing Sheet

ORGANIC ELECTROLUMINESCENT DISPLAY DEVICE COMPRISING AN OPTICAL FILTER

Figure 1:
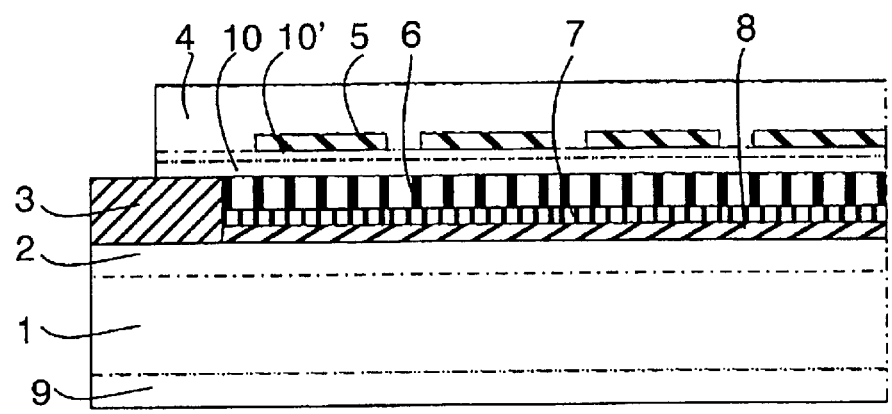

The invention relates to an organic electroluminescent display device (OLED), which comprises a front electrode member, a counterelectrode member, an organic electroluminescent member arranged between the front electrode member and the counterelectrode member, and an optical filter member.

LEDs in accordance with the state of the art customarily are inorganic semiconductor diodes, i.e. diodes whose emitter material is an inorganic semiconductor, for example ZnS, silicon, germanium or a III–V semiconductor such as InP, GaAs, GaAlAs, GaP or GaN with suitable dopants.

As a result of the availability of semiconductive, organic, conjugated polymers and the detection that they could suitably be used to manufacture light-emitting components, persons skilled in the art all over the world embarked upon the development of organic electroluminescent diodes and, based upon said organic electroluminescent diodes, the development of displays. Unlike inorganic LEDs, the application of which in displays having a comparatively high resolution is subject to certain conditions and involves high costs, organic electroluminescent diodes are attributed an enormous potential for small, easy-to-use displays.

Unlike liquid crystal displays, organic electroluminescent displays also have the advantage that they are luminescent and hence do not require an additional backlighting source.

As a result, said organic electroluminescent displays are employed in applications where luminescent display devices with a low supply voltage and low power dissipation are required. Said applications include, in particular, displays for mobile use such as cellular phones, organizers or applications in automobiles, i.e. from radios to navigation systems.

It is important for these display devices, which are frequently used in bright ambient light conditions, that they combine brightness with a strong contrast. A display device that is bright can still be poorly legible because the contrast is insufficient. The contrast is one of the most important characteristics as regards the performance capability of display devices.

Contrast is defined as the ratio of the emitted signal to the total light emission, including the undesirable light, originating from the display device. Under practical conditions, the reflected ambient light plays a dominant role in the undesirable light.

In accordance with a simple measure to increase the contrast, a filter layer that absorbs throughout the spectral range is arranged in front of the display device. In this manner, the contrast of the display device can be increased as much as desired. However, the intensity of the generated light must also be increased to obtain the desired luminance of the display device. This adversely affects the efficiency and the service life of the display device.

The reflected light may be specularly reflected or diffusely reflected light. Specularly reflected light is particularly annoying to the viewer because the image displayed is beset with the specularly reflected image of the disturbing light source. The specularly reflected light is concentrated in the reflection direction and causes the contrast of the display screen to be reduced in the angle of view of the reflection direction. Diffusely reflected light causes the image on the display screen to be beset with a haze that adversely affects the contrast, reduces the visible gray scale and hence reduces the visible information through the display screen.

To increase the contrast of organic electroluminescent display devices, various arrangements with interference and polarization filters were proposed.

For example, WO 0106816 describes an organic electroluminescent component comprising a front electrode that is substantially transparent to electroluminescent light, a counterelectrode that is substantially transparent to ambient light, and an optical interference member to passivate the electroluminescent component and reduce reflection of ambient light behind the counterelectrode.

Surprisingly, it was found that the reduction of reflection of ambient light by the optical interference member falls short of expectations.

Therefore, it is an object of the invention to provide an organic electroluminescent display device having an improved contrast.

In accordance with the invention, this object is achieved by an organic electroluminescent display device comprising a front electrode member, a counterelectrode member, an organic electroluminescent member arranged between the front electrode member and the counterelectrode member, and an optical filter member with a cut-off filter to absorb electromagnetic radiation whose wavelength is below a cut-off wavelength $\lambda_k$, and to transmit electromagnetic radiation whose wavelength is above a cut-off wavelength $\lambda_k$.

The invention is based on the recognition that ambient light is partly absorbed by the organic electroluminescent member of the display device and re-emitted with a different, longer wavelength. This leads to a reduced effect of optical filters, such as interference filters and also polarization filters, which are most satisfactorily used for coherent light in a narrow wavelength range.

The cut-off filter used in accordance with the invention, however, absorbs the radiation from the ambient light that causes emission of light in the organic electroluminescent members.

Preferably, the cut-off wavelength $\lambda_k$ is 500 nm.

It is also preferred that the electroluminescent member comprises a conjugated ladder polymer of the poly (paraphenylene)-type (LPPP).

These conjugated ladder polymers absorb in the blue range of the electromagnetic spectrum and emit in the green-yellow range of the electromagnetic spectrum in which also the sensitivity of the eyes is maximal. For this reason, it is difficult for green-yellow emitting display devices to attain a high contrast. Organic electroluminescent display devices with a conjugated ladder polymer of the poly(paraphenylene)-type (LPPP) as the electroluminescent member profit particularly from the use of a cut-off filter with a cut-off wavelength $\lambda_k$=500 nm.

In accordance with a preferred embodiment of the invention, the cut-off filter contains a yellow dye or a yellow coloring pigment.

Use is preferably made of yellow dyes selected among the group consisting of yellow dyes with the C.I. Index Solvent Yellow 25, Solvent Yellow 83:1, Solvent Yellow 93, Solvent Yellow 98, Solvent Yellow 114, Solvent Yellow 133, Solvent Yellow 163 and Solvent Yellow 179.

Alternatively, yellow coloring pigments may be preferred from the group consisting of the yellow coloring pigments with C.I. Index Pigment Yellow 13, Pigment Yellow 17, Pigment Yellow 53, Pigment Yellow 74, Pigment Yellow 83, Pigment Yellow 110, Pigment Yellow 120 and Pigment Yellow 151.

In accordance with an embodiment of the invention, the optical filter member additionally comprises a polarization filter.

In accordance with an embodiment of the invention, the optical filter member additionally comprises an interference filter.

A metal-dielectric interference filter is particularly preferred because only few additional layers are required to construct such an interference filter.

These and other aspects of the invention are apparent from and will be elucidated with reference to the embodiments described hereinafter.

In the drawing:

FIG. 1 diagrammatically shows the structure of an organic electroluminescent display device.

An organic electroluminescent display device in accordance with the invention comprises a front electrode member, a counterelectrode member, an organic electroluminescent member arranged between the front electrode member and the counterelectrode member, and a cut-off filter to absorb electromagnetic radiation whose wavelength is below a cut-off wavelength $\lambda_k$ and to transmit electromagnetic radiation whose wavelength is higher than a cut-off wavelength $\lambda_k$.

Such a display device typically comprises an arrangement of superposed and partly juxtaposed individual layers. To form such an arrangement of layers use can be made of all layer structures and materials known to persons skilled in the art. Customarily, the OLEDs comprise an electroluminescent layer arranged between a positive electrode as the front electrode and a negative electrode as the counterelectrode, one or both electrodes possibly being transparent and/or segmented. In addition, one or more electron-injection layers and/or electron-transport layers may be arranged between the electroluminescent layer and the positive electrode. Likewise, one or more hole-injection layers and/or hole-transport layers may be arranged between the electroluminescent layer and the negative electrode.

This arrangement of layers may be provided on a substrate of glass, quartz, ceramic, synthetic resin or a transparent flexible plastic film. Suitable synthetic resins are, for example, polyimides, polyethyleneterephtalate and polytetrafluoroethylene.

The electroluminescent layer is arranged between two electrode layers.

The negative electrode supplies electrons which combine with the holes in the organic electroluminescent layer originating from the positive electrode so as to form excitons, and emit photons during the recombination process.

At least one of the electrode layers should be transparent or at least translucent. Customarily, the positive electrode is made of a non-stoichiometric or doped tin oxide, for example ITO, or of a metal with a high work function, for example gold or silver. These electrode materials can be readily used to form transparent layers. Particularly ITO can suitably be used for this purpose as it is highly electroconductive and transparent.

Alternatively, use can be made of a layer of a conductive polyaniline or poly-3,4-ethylenedioxythiophene, whether or not in combination with an ITO layer as the transparent positive electrode.

The negative electrode, which injects electrons into the organic electroluminescent layer, should have a low work function. Materials that can suitably be used for the negative electrode are, for example, indium, aluminum, calcium, barium or magnesium. If the negative electrode is made from reactive barium, it is recommendable to cover this electrode layer with a protective layer of an epoxy resin or an inert metal. These layers have the advantage that their reflectivity is lower than that of metal layers.

It has been found that aromatic, conjugated ladder polymers of the poly(paraphenylene)-type (LPPP), which chemically resemble oligophenylene or polyphenylene, are particularly suitable as organic electroluminescent members for use in organic LEDs. LPPPs demonstrate a continuous chain of conjugated double bonds. Particularly suitable are, for example, soluble polyphenylene ethylene vinylene and soluble polythiophene, in particular polyphenylenevinylene, which are further substituted at the phenyl ring, in the $2^{nd}$ and $5^{th}$ position, with alkyl or alkoxy residues. Such polymers are readily processable and yield layers having an amorphous structure. Examples of suitable polyphenylene vinyls are poly(2-methyl-5-(n-dodecyl)-p-phenylenevinylene, poly(2-methyl-5-(3,5,dimethyloctyl)-p-phenylenevinylene, poly(2-methyl-5-(4,6,6,-trimethylheptyl) -p-phenylenevinylene, poly(2-methoxy-5-dodecyloxy-p-phenylenevinylene and poly(2-methoxy-5-(ethylhexyloxy)-phenylenevinylene (MEH-PPV).

Apart from electroluminescence, LPPPs also exhibit photoluminescence. The ladder polymers have a characteristic absorption spectrum with a sharp absorption edge and a distinctive vibronic microstructure. The photoluminescence of the LPPPs is characterized by a photoluminescence (PL) that is axisymmetric to the absorption, a Stokes' displacement of the order of 150 cm$^{-1}$ taking place.

Display devices comprising two different electroluminescent layers clearly outperform organic, electroluminescent display devices having only one electroluminescent layer. One layer effectively transports holes, for example PPV, and one layer effectively transports electrons, for example oxadiazole. This enables holes and electrons to recombine more readily.

Polyethylenedioxythiophene PEDOT and polyethylenedioxythiophene-polystyrenesulphonate PEDOT-SS are particularly advantageous for transporting positive charge carriers. For transporting positive charge carriers use is very advantageously also made of 4,4',4"-tris [N-(1-naphtyl)-N-phenyl-amino]-triphenylamine in combination with hydroxyquinoline aluminum-III-salt Al$_{q3}$ as the emission and electron transport material.

The display device in accordance with the invention comprises a cut-off filter, which is embodied so as to be a long-pass filter for light having a wavelength $\lambda_k$ of 500 nm. Said cut-off filter has a low transmission in the range below the cut-off wavelength of 500 nm (stop band) and a high transmission in the range above the cut-off wavelength (passband). Preferably, the transmission of the cut-off filter at the maximum level of the emitted radiation is at least approximately a factor of 10 greater than the transmission at the maximum level of the absorbed radiation of the organic electroluminescent components. The cut-off frequency of the filter is $\lambda_k \leq 500$ nm, which value is adapted to the wavelength of the maximum emission of the electroluminescent layer.

FIG. 1 shows an organic electroluminescent display device with a cut-off filter.

Said organic electroluminescent display device comprises a glass substrate 1, an adhesive layer of SiO$_2$ 2, an anode 8 of ITO with contact terminals 3, a passivation layer of polyimide 4, an electroluminescent layer 7 of PDOT, a second electroluminescent layer 6 of PPV, a cathode of Al 5 with a metal-dielectric filter of barium 10 and ITO 10', and a cut-off filter 9.

The cut-off filter is situated in front of the electroluminescent layer, so that the radiation originating from the electroluminescent layer must pass through the cut-off filter. The spectral range of the light passed by the cut-off filter essentially corresponds to the radiation emitted by the electroluminescent layer, so that said radiation penetrates the cut-off filter substantially without loss of intensity. External ambient light passes the cut-off filter before being incident on the reflective layers of the display device where it is reflected. Thus, only light of the same wavelength as that emitted by the display device is incident on said display device, so that the reflection of ambient light is reduced substantially.

The cut-off filter contains a yellow pigment or a yellow dye that is uniformly distributed or dissolved in a carrier, or that is applied onto a carrier. Suitable carriers are glass as well as optically transparent synthetic resins, such as polyester, polyacrylates, polymethylmethacrylates, polyolefins, polycarbonates, polystyrenes and the like. Polyethyleneterephtalates and polybutyleneterephtalates are polyesters that are particularly suitable.

The cut-off filter may be embodied so as to be a self-supporting foil or a thin-film coating. Said cut-off filter may be arranged at any location in the organic electroluminescent display device in front of the electroluminescent layer. Preferably, a self-supporting foil has a thickness in the range from 100 μm to 1000 μm, and a thin-film coating has a thickness in the range from 100 μm to 1000 μm. The support may also be a clear lacquer, for example an acrylic resin clear lacquer or a urethane clear lacquer, or it may be a synthetic resin coating. The clear lacquer or synthetic resin coating serving as a cut-off filter may be applied to one of the layers of the organic electroluminescent display device in front of the electroluminescent layer.

Transparent monoazo yellow pigments, diaryl yellow pigments and yellow bisazo condensation pigments, which are characterized by their light-fastness, proved to be very suitable yellow pigments. In the case of pigments, transparency is achieved, for example, through a grain size <200 nm.

In Table 1 and Table 2, suitable yellow dyes and coloring pigments are listed.

TABLE 1

Yellow dyes

| Color index | Trade name | Manufacturer |
| --- | --- | --- |
| Solvent Yellow 25 | Orasol Yellow 3R | Ciba-Geigy Corp. |
| Solvent Yellow 83:1 | Savinyl Yellow RLS | Cariant |
| Solvent Yellow 93 | Sandoplast Yellow 3G | Cariant |
| Solvent Yellow 98 | Hostasol Yellow 3G | Cariant |
| Solvent Yellow 114 | Sandoplast Yellow 2G | Cariant |
| Solvent Yellow 133 | Polysynthren Yellow GG | Cariant |
| Solvent Yellow 163 | Oracet Yellow 8GF | Ciba-Geigy Corp. |
| Solvent Yellow 179 | Macrolex Yellow 6G | Bayer |

TABLE 2

Yellow pigments

| Color index | Trade name | Manufacturer |
| --- | --- | --- |
| Pigment Yellow 13 | Irgalite Yellow | Ciba-Geigy Corp. |
| Pigment Yellow 17 | Graphtol Yellow GG | Cariant |
| Pigment Yellow 53 | Irgacolor Yellow 10401 | Ciba-Geigy Corp. |
| Pigment Yellow 74 | Unisperse Yellow | Ciba-Geigy Corp. |
| Pigment Yellow 83 | PV Fast Yellow HR | Cariant |
| Pigment Yellow 83 | Microlith Yellow | Ciba-Geigy Corp. |
| Pigment Yellow 110 | Chromophtal Yellow | Ciba-Geigy Corp. |
| Pigment Yellow 120 | PV Fast Yellow H2G | Cariant |
| Pigment Yellow 151 | Permajet Yellow H4G | Cariant |

The yellow pigment or the yellow dye allows passage of all electromagnetic radiation having a wavelength above 500 nm and absorbs radiation having a wavelength below 500 nm.

The display device in accordance with the invention may further comprise optical filter members that suppress the reflections within the display device. These reflections develop, on the one hand, at the interfaces between the layers of the display device, which layers have different refractive indices, and, on the other hand, at the metal cathode which acts like a metal mirror.

To suppress these specular reflections, the display device may comprise a polarization filter of known construction, for example a circular polarization filter. A simple circular polarization filter is composed of a linear polarizer and a λ/4 plate (quarter wave plate). The circular polarization filter is embedded in the display device in such a manner that the light reflex is incident first on the linear polarizer and then passes the quarter wave plate. If the light reflex is reflected by the display device, the quarter wave plate is passed twice, as a result of which linearly polarized light is rotated through 90° with respect to the original direction. As a result, the linear polarizer absorbs the reflected light reflex.

The display device may additionally comprise an interference filter, as known from the prior art, for example EP 0272760. For example, use can be made of a dielectric multilayer filter composed of a plurality of layers of dielectric materials with alternately a high and a low refractive index, for example $TiO_2$ with n=2.1 and $MgF_2$ with n=1.3. Alternatively, use can advantageously be made of a metal dielectric interference filter, which comprises alternately a metal layer and a dielectric layer, and which has to include only few layers.

To suppress light reflection at the cathode, said cathode may be coated with an electroconductive, light-absorbing layer.

The display device in accordance with the invention may additionally comprise devices that influence the electro-optical properties, such as UV filters, anti-reflex coatings, devices known as microcavities, such as color-conversion and color-correction filters. Furthermore, the display device is enclosed in a hermetic seal shielding it from environmental influences, such as moisture and mechanical loads.

The display device may be embodied so as to be, for example, a segmented display or a matrix display with separately addressed pixels. Only the shape of the electrodes enables the individual pixels to be readily manufactured, since the polymeric material of the organic electroluminescent component has a high resistance. Consequently, the diffusion of the charge carriers is minimal, so that crosstalk between the pixels is precluded.

A complete display screen is obtained by adding an electronics section to the display device.

What is claimed is:

1. An organic electroluminescent display device comprising a front electrode member, a counterelectrode member, an organic electroluminescent member arranged between the front electrode member and the counterelectrode member, and an optical filter member, disposed in front of the electroluminescent member, with a cut-off filter to absorb electromagnetic radiation from ambient light that causes emission of light in the electroluminescent member, and whose wavelength is below a cut-off wavelength $\lambda_k$, and to transmit electromagnetic radiation whose wavelength is above a the cut-off wavelength $\lambda_k$, and wherein a spectral range of light passed by the cut-off filter substantially corresponds to radiation emitted by the electroluminescent member.

2. An organic electroluminescent display device as claimed in claim 1, wherein the cut-off wavelength $\lambda_k$ is 500 nm.

3. An organic electroluminescent display device as claimed in claim 1, wherein the electroluminescent member comprises a conjugated ladder polymer of the poly (paraphenylene)-type (LPPP).

4. An organic electroluminescent display device as claimed in claim 1, wherein the cut-off filter contains a yellow dye or a yellow coloring pigment.

5. An organic electroluminescent display device as claimed in claim 4, wherein the yellow dye is selected from the group consisting of yellow dyes with the C.I. Index Solvent Yellow 25, Solvent Yellow 83:1, Solvent Yellow 93, Solvent Yellow 98, Solvent Yellow 114, Solvent Yellow 133, Solvent Yellow 163 and Solvent Yellow 179.

6. An organic electroluminescent display device as claimed in claim 4, wherein the yellow coloring pigment is selected from the group consisting of yellow coloring pigments with the C.I. Index Pigment Yellow 13, Pigment Yellow 17, Pigment Yellow 53, Pigment Yellow 74, Pigment Yellow 83, Pigment Yellow 110, Pigment Yellow 120 and Pigment Yellow 151.

7. An organic electroluminescent display device as claimed in claim 1, wherein the optical filter member additionally comprises a polarization filter.

8. An organic electroluminescent display device as claimed in claim 1, wherein the optical filter member additionally comprises an interference filter.

9. An organic electroluminescent display device as claimed in claim 8, wherein the interference filter is a metal-dielectric interference filter.

* * * * *